United States Patent [19]

House

[11] Patent Number: 4,494,105
[45] Date of Patent: Jan. 15, 1985

[54] TOUCH-CONTROLLED CIRCUIT APPARATUS FOR VOLTAGE SELECTION

[75] Inventor: V. Dean House, Orem, Utah

[73] Assignee: Spectra-Symbol Corporation, Salt Lake City, Utah

[21] Appl. No.: 362,475

[22] Filed: Mar. 26, 1982

[51] Int. Cl.³ .............................................. H01C 10/10
[52] U.S. Cl. ....................................... 338/114; 338/69
[58] Field of Search ............. 338/69, 114; 84/DIG. 7, 84/1.17, 1.24

[56] References Cited

U.S. PATENT DOCUMENTS

| | | | |
|---|---|---|---|
| 2,866,124 | 12/1958 | Giuffrida et al. | 338/90 |
| 2,902,607 | 9/1959 | Hedger et al. | 323/354 |
| 2,907,824 | 10/1959 | Peek | 338/90 |
| 2,973,140 | 2/1961 | Katz | 338/90 |
| 3,063,018 | 11/1962 | Gordon et al. | 328/147 |
| 3,178,566 | 4/1965 | Harpell | 338/90 |
| 3,290,495 | 12/1966 | Malmros | 338/90 |
| 3,358,151 | 12/1967 | Haase | 307/15 |
| 3,440,522 | 4/1969 | Kruse | 338/119 |
| 3,551,820 | 12/1970 | Bagwell | 325/465 |
| 3,624,583 | 11/1971 | Nakada | 338/69 |
| 3,624,584 | 11/1971 | Ohno | 338/69 |
| 3,626,350 | 12/1971 | Suzuki et al. | 338/69 |
| 3,699,492 | 10/1972 | Yoshihara | 338/69 |
| 3,783,392 | 1/1974 | Drake et al. | 328/127 |
| 3,789,391 | 1/1974 | Brock et al. | 340/347 SY |
| 3,895,288 | 7/1975 | Lampen et al. | 323/94 R |
| 3,927,593 | 12/1975 | Kawamura | 338/69 |
| 3,952,156 | 4/1976 | Lahr | 338/90 |
| 3,968,467 | 7/1976 | Lampen et al. | 338/119 |
| 3,982,219 | 9/1976 | Rehak | 338/96 |
| 4,014,217 | 3/1977 | Lagasse et al. | 338/114 |
| 4,128,209 | 12/1978 | Johnson | 239/583 |
| 4,137,517 | 1/1979 | Garcea | 338/118 |
| 4,203,088 | 5/1980 | Sado et al. | 338/69 |
| 4,235,141 | 11/1980 | Eventoff | 338/69 |
| 4,268,815 | 5/1981 | Eventoff et al. | 338/69 |

Primary Examiner—C. L. Albritton
Attorney, Agent, or Firm—Workman, Nydegger & Jensen

[57] ABSTRACT

A touch-controlled apparatus of the type in which two parts of a circuit component are selectively brought into contact, which includes plural circuit components. In one embodiment the two components (at least one of which must be a potentiometer) are co-planar and longitudinally aligned. In another embodiment two co-planar potentiometers are disposed in parallel side-by-side relation so as to be simultaneously actuated by the same touch pressure. In a third embodiment two or more components are disposed in two different stacked layers for simultaneous or sequential operation. An improved sample and hold output circuit includes only a parallel capacitor, or a series resistor and parallel capacitor, connected to one part of a circuit component. The component may be formed as three folded sections of a single sheet-like member, the sections being foldable into a three-tiered stack.

49 Claims, 9 Drawing Figures

TOUCH-CONTROLLED CIRCUIT APPARATUS FOR VOLTAGE SELECTION

BACKGROUND

1. Technical Field of the Invention

The present invention relates to potentiometers designed to provide voltage selection over a continuous range of voltages. More particularly, the present invention relates to a touch-controlled circuit apparatus which provides voltage selection over a first continuous range of voltages while providing either separately or simultaneously for voltage selection over additional discrete and/or continuous ranges of voltages.

2. The Prior Art

Potentiometers for controlling voltage selection are used in numerous types of applications in both home and industry. For example, these devices may be used in the control panels of such things as aircraft and aerospace applications, large construction equipment, computers, lighting systems, arcade games, or kitchen appliances, to name just a few.

In the past the prior art potentiometers for providing voltage selection having typically been of three types. One type provides a manually operated mechanical wiper that is typically controlled by a knob or slider on a control panel. The wiper is always on contact with a resistive element, which provides for voltage selection over a continuous range of voltages. The constant mechanical contact between the wiper and resistive element tends to accelerate the wear and eventual destruction of this type of potentiometer.

A second, more recent type of potentiometer provides an elongated resistive element and an elongated wiper that is parallel to and spaced from the resistive element. See, for example, U.S. Pat. Nos. 3,624,584 (Ahno) and 3,699,492 (Yoshihara). In this type of potentiometer, the elongated wiper is not in constant contact with the resistive element, but achieves voltage selection by depressing the wiper at selected locations along its length to bring it into contact with the resistive element, which has a voltage applied to it. Although this type of device reduces wear, it is not possible to produce a continuous range of output voltage levels because the wiper in this type of prior art device is typically segmented. Thus, there is some sacrifice in the ability to accurately control voltage selection, which makes the device less versatile.

Recently, there has been devised yet another type of potentiometer. See, for example, U.S. Pat. Nos. 3,895,288 and 3,968,467 (both to Lampen, et al.). This type of device typically includes a continuous length of electrically resistive material, a corresponding continuous length of electrically conductive material which serves as the wiper, and an electrically insulating spacer which serves to simultaneously support and separate the resistive and conductive materials. Either one or both of the resistive and conductive materials are designed as flexible members so that they can be pressed together at any selected location along their length to bring them into electrical contact with each other.

If a voltage is applied across the resistive material, a voltage gradient is established along the length of the material. The voltage gradient may be a linear or non-linear function of the material's length depending upon the particular composition of resistive materials used. Thus, touching either the top or bottom surface of the flexible member will cause the resistive and conductive materials to contact each other, producing a voltage output on the conductive material or wiper. The advantage of this device is that it minimizes wiper contact and reduces wear and yet provides a continuous range of output voltage levels, since the conductive wiper is not segmented.

There are many applications where it is desirable to combine both potentiometers (which provides voltage selection over a continuous range of voltages) and devices such as switches which permit selection of discrete voltages. For example, in nearly every application involving voltage selection over continuous ranges of voltages, there is also a need for at least an on/off switch.

In addition, in many applications involving computers, motor controls, level controls and the like, switches and potentiometers are required to work in tandem simultaneously for selecting such things as cursor position, motor speed and direction. Thus, in prior art applications, several separate types of voltage selection devices have been required in most electrical control panels. As a result of this problem, there have been some attempts to combine the continuous range and discrete voltage selection components in a single element. Such attempts are reflected in U.S. Pat. Nos. 3,626,350 (Suzuki) and 3,624,583 (Nakada).

In the Suzuki patent, plural potentiometers are oriented in side-by-side parallel relationship, and in the Nakada patent, there are a series of switches aligned with one another in parallel relationship to a linear potentiometer. In the case of parallel potentiometers, Suzuki expressly prevents simultaneous actuation of two or pore potentiometers when touch pressure is applied to only one. Thus, Suzuki is not useable in applications where simultaneous control of plural potentiometers is desirable. Further, the cost of both the Suzuki and Nakada devices is increased by virtue of the need for isolating structure between the parallel components.

It would reduce the cost and overall dimensions of a device having both potentiometers and discrete voltage switches if the potentiometer and switches could be constructed so as to utilize the same longitudinal conductive element for transmitting the selected voltages. However, this improvement has not been possible in the prior art because prior art devices require that the individual potentiometers extend over the entire useful length of the element.

It should also be noted that, in some applications, it is desirable to actuate two potentiometers, two switches, or a potentiometer and a switch simultaneously, with the option available for sequential operation controlled by the level of applied pressure. This situation would exist, for example, where a single controller is used to operate several processes or machines in performing simultaneous and identical functions. The prior art devices do not provide for this feature.

For some applications, it is desirable to provide a sample and hold output circuit which is actuated when the touch controlled component is actuated to store the voltage applied to the electrically conductive surface. A prior art sample and hold circuit of this type is disclosed in the aforementioned Lampen et al. patent (U.S. Pat. No. 3,968,497). This patent discloses a voltage comparator which actuates a switch to charge a capacitor across a pair of resistors and through a diode whenever the touch-controlled element is actuated. It is believed that these circuit components are not all required in order to accomplish the intended function of sampling and storing the output signal from the control device.

The pressure activated control devices of the prior art are generally fabricated from two separate layers of material, each bearing the required electrical characteristics in their surfaces. Spacer means are then disposed between the layers to maintain separation of the surfaces in the absence of actuation pressure. The process of separately forming and bonding these individual layers and spacer members in order to assemble the final element is relatively time-consuming and expensive.

In light of the above, it would be a great improvement in the art to provide a pressure activated control circuit apparatus for providing voltage selection over a first continuous range of voltages which also providing, either separately or simultaneously, for voltage selection over additional discrete and/or continuous ranges of voltages. It would be a further important improvement to provide such an apparatus which utilizes a small number of component parts, which is compact in configuration, and which is simple and inexpensive to manufacture.

BRIEF DESCRIPTION AND OBJECTS OF THE INVENTION

The present invention comprises a touch-controlled circuit apparatus capable of simultaneously or separately producing and storing output voltage signals which are selected from one or more continuous ranges of voltages and/or from discrete voltages. The invention utilizes a minimum number of components in a compact and unique configuration that can be easily and inexpensively manufactured.

In one preferred embodiment of the present invention, the touch-controlled circuit apparatus includes a first potentiometer and at least one additional potentiometer or at least one additional switch arranged in co-planar longitudinal alignment with the first potentiometer so that all potentiometers and switches utilize the same conductive member. The additional potentiometer or switch can function so as to provide an output voltage range or voltage which is dependent upon the longitudinal pressure point, but is not necessarily within the continuous range of output voltages provided by the first potentiometer.

In another preferred embodiment of the present invention, two potentiometers, at least two switches, or one or more switches and a potentiometer are stacked one atop the other in a two-tiered configuration so that a single applied pressure can derive two separate output voltages simultaneously or sequentially, depending upon the magnitude of the applied pressure.

In still another preferred embodiment of the present invention, two potentiometers are arranged in co-planar, side-by-side relation, in one tier of a two-tiered configuration so as to permit two position-dependent output voltages to be provided from that one tier of the element in response to appropriate pressure application.

The embodiments of the present invention can include a very uncomplicated sample and hold circuit consisting of a parallel capacitance, or a series resistance and parallel capacitance. This sample and hold circuit is connected to the output conductive surface of a touch-controlled circuit apparatus so as to store the most recent output voltage produced by that device. The simplicity of this sample and hold circuit drastically reduces the cost and complexity of prior art circuits used with such devices.

The present invention may be inexpensively and easily manufactured by employing a single sheet to form the supports for surfaces in the touch-controlled circuit apparatus. The sheet is folded so that the operative surfaces of components of the apparatus overlie one another in closely spaced juxtaposition.

It is, therefore, a primary object of the present invention to provide a touch-controlled circuit apparatus which provides voltage selection over a first continuous range of voltages while providing, either separately or simultaneously, for voltage selection over additional discrete and/or continuous ranges of voltages.

It is a further important object of the present invention to provide a touch-controlled circuit apparatus which provides for voltage selection over multiple discrete and/or continuos ranges of voltages, with all voltages being selected by means of a common electrically conductive surface.

It is also an important object of the present invention to provide a touch-controlled circuit apparatus which may be constructed in one of several configurations in order to satisfy the particular electronic and/or packaging requirements of the user.

It is another important object of the present invention to provide a simplified and efficient sample and hold circuit for receiving and storing voltages corresponding to those produced on the output of the touch-controlled circuit apparatus.

It is still another important object of the present invention to provide a touch-controlled apparatus which includes a minimum number of component parts and is simple and inexpensive to manufacture.

These and other objects of the present invention will become more fully apparent from the following description and appended claims taken in conjunction with the accompanying drawings.

DETAILED DESCRIPTION OF THE PREFERRED EMBODIMENTS

Reference is now made to the drawings wherein like parts are designated with like numerals throughout.

As noted above, touch-controlled elements of the general type with which this invention is concerned are disclosed in U.S. Pat. No. 3,968,467 to Lampen et al. The disclosure in that patent, insofar as it relates to resistive, conductive, and insulative materials used in touch-controlled elements and to certain prior art fabrication techniques, is expressly incorporated herein by reference.

Figure 1:
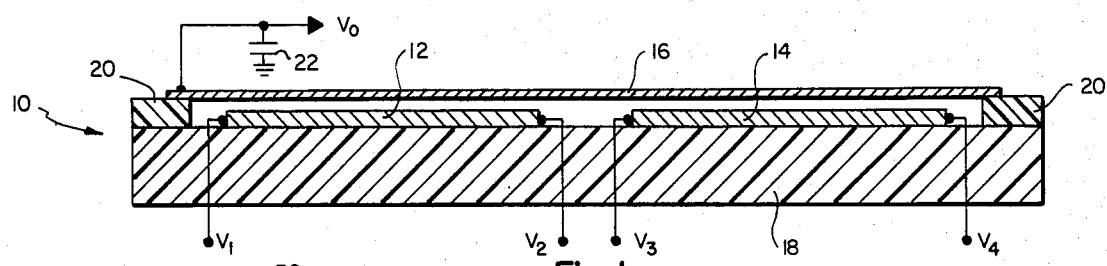
FIG. 1 is a cross-sectional view of one embodiment of the touch-controlled element of the present invention, where one embodiment of a sample and hold circuit of the present invention is shown in schematic form.

Referring now to FIG. 1, one touch-controlled element of the present invention is generally designated by reference numeral 10. Touch-controlled element 10 includes elongated electrically resistive members 12 and 14 and an elongated electrically fully conductive member 16.

For purposes of the description and the claims of the present invention as set forth herein, the terms "fully conductive" or "conductive" (used alone) are used to indicate negligible electrical resistance, as opposed to "resistive" on the one hand and "insulative" on the other hand. Likewise, the term "resistive" is used herein to indicate a resistance to current flow such that a voltage gradient is established across a "resistive" surface when current flows therealong in response to a voltage differential applied thereacross.

Further, the phrase "electrical conductivity characteristic" is used to designate the inherent current conducting capability of material in response to an applied voltage and encompasses both "fully conductive" (or "conductive") and "resistive" elements. The term "insulative", on the other hand, designates no current flow capability.

Touch-controlled element 10 is shown in cross-section taken parallel to an axis of elongation of resistive elements 12 and 14 and conductive member 16. Resistive elements 12 and 14 are disposed in spaced end-to-end relationship in longitudinal alignment and are overlayed by conductive member 16 disposed in adjacent but closely-spaced juxtaposition. It should be noted that resistive elements 12 and 14, and all other resistive elements described hereinbelow, need not to resistive throughout their depth; rather, only a coating or surface facing member 16 need be rendered resistive. Likewise, the conductive member 16, and all other conductive members described herein, need only have conductive surfaces facing a corresponding resistive (or, in some cases, conductive) member or surface.

The respective surfaces of resistive member 12 and 14 which face conductive member 16 are substantially co-planar. One expedient for securing members 12 and 14 in the manner described is, as shown in FIG. 1, to bond the members to a substrate 18 which is formed of an insulative material. Insulative substrate 18 and conductive member 16 are rigidly interconnected by means of an insulating frame 20. With these members so interconnected, by means of a suitable adhesive or bonding technique, the presented surfaces of conductive member 18 and resistive members 12 and 14 are closely spaced by means of insulating frame 20.

Conductive member 16 is transversely flexible, such that it may be flexed to contact either of resistive members 12 or 14 at a longitudinal position corresponding to a point at which a normal flexing force is applied. The thickness and material of member 16 are selected so that this operative force or pressure may be applied easily by an operator's finger tip.

Contact between the mutually presented surfaces of conductive member 16 and resistive members 12 and 14 results in transfer to conductive member 16 of the voltage appearing at the contacted point of members 12 or 14. To this end, a differential voltage $V_2-V_1$ is applied across the ends of resistive member 12 to establish a longitudinal voltage gradient thereacross. Similarly, a differential voltage $V_4-V_3$ is applied across resistive member 14. These differential voltages may overlap, have separated ranges or be identical.

The differential voltage $V_2-V_1$ establishes a voltage gradient extending lengthwise along resistive member 12 so that a voltage in the range $V_2-V_1$ may be transferred to conductive member 16 on contact. Likewise, contact with resistive member 14 transfers a voltage in the range $V_4-V_3$ to conductive member 16. In either case, the transferred voltage is dependent upon the longitudinal position of the galvanic contact point. The resistance of members 12 and 14 may vary linearly or non-linearly with length in order to achieve any desirable voltage versus position characteristic for each of the two potentiometers.

The voltages $V_1$, $V_2$, $V_3$, and $V_4$ may be shown, at, or below ground potential. An output sample and hold circuit consisting of capacitance 22, is connected between conductive member 16 and a reference potential, such as ground. (It will be appreciated that capacitance 22 may include more than one capacitor appropriately interconnected to yield the desired capacitance.) The circuit output voltage is taken across capacitance 22 which stores the voltage appearing between conductive member 16 and ground. The stored voltage discharges through the load circuit upon removal of the galvanic contact between conductive member 16 and either of resistive member 12 or 14. The discharge time contact is determined by capacitance 22 and the load impedance. In light of the foregoing, it becomes apparent that the sample and hold circuit constituted by capacitance 22 of the present invention is far simpler and less expensive than the prior art circuit described hereinabove.

Figure 2:
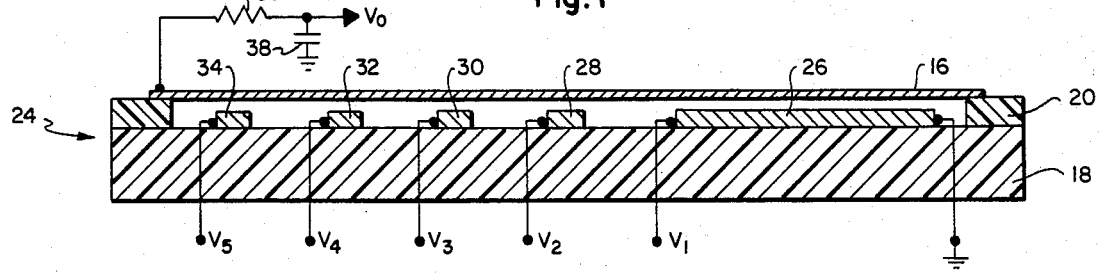
FIG. 2 is a cross-sectional view of another embodiment of the touch-controlled element of the present invention, where another embodiment of a sample and hold circuit of the present invention is shown in schematic form.

Referring now to FIG. 2, another embodiment of a touch-controlled element 24 within the scope of the present invention is illustrated. Touch-controlled element 24 includes a substrate 18 and conductive element 16 separated and secured to insulative frame 20 in the manner described with respect to the embodiment illustrated in FIG. 1. Mounted on substrate 18, in the space between the substrate and conductive member 16, are resistive member 26 and conductive members 28, 30, 32, and 34. Resistive member 26 is similar to resistive members 12 and 14 of FIG. 1. Conductive members 28, 30, 32, and 34 have conductive surfaces presented to conductive member 16, such surfaces being substantially co-planar with the presented surface of resistive member 26. In addition, conductive members 28, 30, 32, and 34 are longitudinally aligned with resistive member 26 and are positioned at successive longitudinally-spaced locations.

As illustrated, ground potential may be applied to one end of resistive element 26 and voltage $V_1$ may be applied to the other end to establish a voltage gradient between $V_1$ and ground along the length of that resistive member. Conductive members 28, 30, 32, and 34 are connected to respective voltages $V_2$, $V_3$, $V_4$, and $V_5$, which voltages may be successively higher than $V_1$ or at any other selected levels above or below $V_1$. If conductive member 16 is pressed against resistive member 26, the former will have a voltage transferred thereto which is dependent upon the longitudinal position of the pressure point. This voltage varies continuously as the pressure point is varied along the length of resistive member 26.

Therefore, resistive member 26, like respective members 12 and 14 of FIG. 1, forms a potentiometer with conductive member 16. However, when the pressure point is moved into registry with conductive members 28, 30, 32, and 34, the voltage transferred to conductive member 16 changes in discrete steps to $V_2$, $V_3$, $V_4$, and $V_5$. Conductive elements 28, 30, 32, and 34 therefore co-operate with conductive member 16 to form respectively, selectively actuable switches.

The sample and hold output circuit illustrated in FIG. 2 includes a series resistance 36, connected at one end to conductive member 16 and at the other end to the element output terminal, and a parallel capacitance 38, connected between the other side of resistance 36 and ground. This sample and hold circuit is similar to the one described in relation to FIG. 1, but it is provided with resistance 36 to limit current flow during charging of capacitance 38, thereby controlling the voltage level stored in the capacitance.

It will be appreciated that the inventive concept embodied in the elements of FIGS. 1 and 2 permits a potentiometer to be employed in conjunction with any combination of other potentiometers or switches longitudinally aligned therewith. For example, in FIG. 3, there is illustrated a succession of members disposed on substrate 18 including conductive members 40 and 42, resistive member 44, conductive members 46 and 48, and resistive member 50. Voltages $V_1$ and $V_2$ are applied to conductive members 40 and 42, respectively; voltage $V_4$-$V_3$ is applied across resistive member 44; voltages $V_5$ and $V_6$ are applied to conductive members 46 and 48, respectively; and voltage $V_8$-$V_7$ is applied across resistive member 50. Conductive members 40, 42, 46, and 48 form respective switches with conductive member 16 which forms respective potentiometers with resistive members 44 and 50. The output voltage $V_0$ appears on conductive member 16.

It should be noted with respect to the embodiments described herein that resistive members 12 and 14, 26, and 44 and 50 can be disposed on a flexible member and that the conductive member 16 can be rigid. Alternatively, both the resistive and conductive members may be flexible. Since the important point is that one surface should be sufficiently flexible to establish the desired galvanic contact, it is immaterial which member provides the flexibility.

Figure 3:
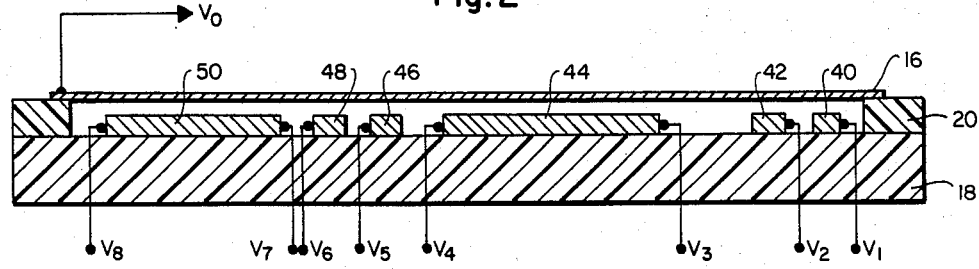
FIG. 3 is a cross-sectional view of still another embodiment of the touch-controlled element of the present invention.
Figure 4:
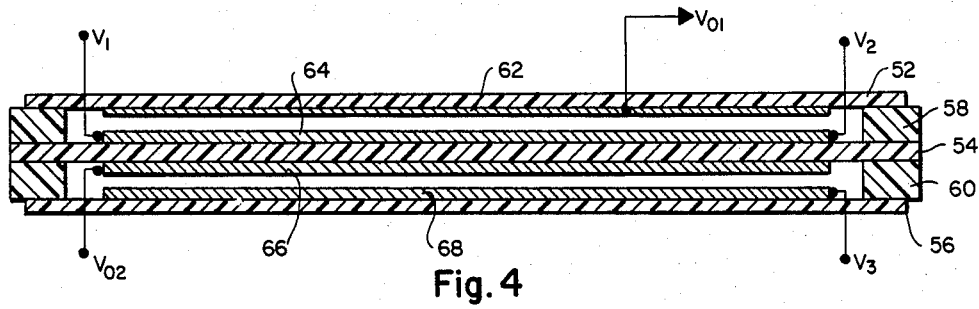
FIG. 4 is a cross-sectional view of a further embodiment of the touch-controlled embodiment of the present invention.

Referring now to FIG. 4, another embodiment of the present invention includes three stacked insulative members designated 52, 54, and 56 from top to bottom. Members 52 and 54 are spaced apart by insulative frame 58, whereas members 54 and 56 are spaced apart by insulative frame 60. The presented faces of members 52 and 54 have conductive member 62 and resistive member 64, respectively, disposed therein in closely spaced juxtaposed relation to form a longitudinally-extending potentiometer. It will be appreciated that two or more such potentiometers may be provided between members 52 and 54 by providing more than one longitudinally aligned resistive members in the manner described above with respect to FIGS. 1 and 3.

In addition, the embodiment of FIG. 4 may be provided with switches in the manner described with respect to FIGS. 2 and 3. For the single potentiometer formed between members 52 and 54 in the illustrated embodiment, the voltage gradient is established by differential voltage $V_2$-$V_1$ applied across resistive member 64. The potentiometer output voltage $V_{01}$ is derived from the voltage appearing on conductive member 62.

A further conductive member 66 is disposed on the surface of member 54 opposite resistive member 64 and facing insulative member 56. Another conductive member 68 is disposed on the surface of member 56 facing member 54. The two conductive members 66 and 68 comprise a switch which is closed when these two members are brought into galvanic contact. Conductive members 66 and 68 are aligned depthwise with resistive member 64 and conductive member 62, and are substantially co-extensive with these members. It will be appreciated that a plurality of switches and/or potentiometers can be provided between members 54 and 56 instead of the single switch. A supply voltage $V_3$ is connected to one of the switch contacts, for example, conductive member 68, whereas the switch output voltage $V_{02}$ is taken from the other contact, e.g., conductive member 66.

Either members 52 and 54, or members 56 and 54, or all three members are sufficiently flexible to permit members 62 and 64 to mutually contact and members 66 and 68 to mutually contact when appropriate pressure is applied by an operator's finger tip to member 52 or member 56, as the case may be. The result is a closure of the switch so that output voltage $V_{02}$ is at voltage $V_3$ while, at the same time, the other output voltage $V_{01}$ is at a voltage between $V_2$ and $V_1$ as determined by the longitudinal position of the applied finger pressure. It should be noted that a somewhat lower finger pressure can be applied so that only output $V_{01}$ is provided (if the lower pressure is applied to member 52) or only output $V_{02}$ is provided (if the finger pressure is applied to member 54). Delayed actuation of the switch or potentiometer with increasing finger pressure is also possible.

The flexure resistance to finger pressure is one parameter which can be used to design the element for simultaneous, selective, or successive operation. Specifically, the less resistant the members 52, 54, and 56 are to flexure, the greater the tendency toward simultaneous operation without selective or sequential operation. Another design parameter for this purpose is the spacing between the operative galvanic contact surfaces and between the members 52, 54, and 56.

It should be noted that the members 52 and 56 may be eliminated, whereby members 62 and 68, respectively, would constitute both part of the electrical component and the member to which actuating finger pressure is applied. This modification is similar to the use of member 16 in the embodiment of FIG. 1. Likewise, it will be appreciated that the resistive (64) and conductive (62) components in the potentiometer can be positionally interchanged within the scope and spirit of the invention.

Figure 5:
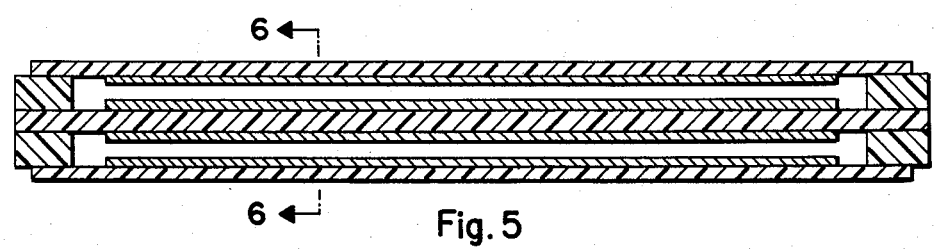
FIG. 5 is a cross-sectional view of a still further embodiment of the touch-controlled element of the present invention.
Figure 6:
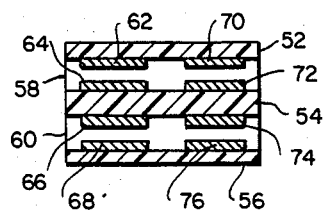
FIG. 6 is a cross-sectional view taken along lines 6—6 of the embodiment of the touch-controlled element illustrated in FIG. 5.

The embodiment of the present invention illustrated in FIG. 5 is similar to the embodiment of FIG. 4, except that, as seen in the transverse cross-sectional view of FIG. 6, a second set of components are provided in each tier or layer of the device. More particularly, one or more members 70 are provided on member 52 to extend parallel to and substantially co-planar with member 62. A similar member (or members) 72 is provided on insulative member 54 in closely spaced juxtaposition with member 70. One of the members 70 may be conductive and the other resistive to form a potentiometer, or both may be conductive to form a switch. The members 70 and 72 may be positioned sufficiently close to members 62 and 64 in a transverse sense so as to permit simultaneous actuation of both components in response to a single finger-applied pressure; alternatively, the components may be transversely spaced sufficiently to require separate applied finger pressures for actuation.

A corresponding set of members 74 and 76 are disposed parallel to members 66 and 68, respectively, to establish another component between members 54 and 56. The predetermined electrical conductivity characteristics of the members 74 and 76 determine whether this other component is a switch or a potentiometer.

The touch-controlled elements of the present invention have a variety of uses. One particularly practical device is in a proportional controller wherein an analog control voltage is provided and wherein it is desired to provide discrete indications of the control voltage achieving successive threshhold levels. Such a device is illustrated in FIG. 7 to which specific reference is now made.

Figure 7:
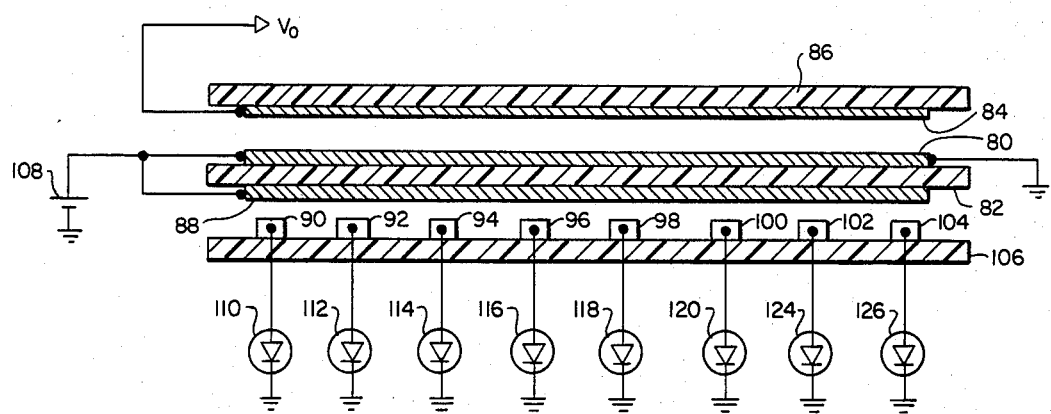
FIG. 7 is a cross-sectional view of an additional embodiment of the touch-controlled element of the present invention, in which additional circuit components have been shown in schematic form.

FIG. 7 illustrates a two-tiered element including a potentiometer comprising a resistive member 80 disposed on one surface of middle insulative member 82 and a conductive member 84 disposed on a facing surface of one insulative end member 86. The second tier component is a plurality of switches comprising conductive member 88 as one contact of each switch and longitudinally-spaced conductive members 90, 92, 94, 96, 98, 100, 102, and 104 as the other contacts of respective switches. Conductive member 88 is disposed on the surface of member 82 opposite resistive member 80 and is oriented in substantial depthwise alignment with member 80. Conductive members 90, 92, 94, 96, 98, 100, 102, and 104 are disposed on the other end member 106 and are spaced in a longitudinally-extending array with surfaces presented to member 88 in closely spaced juxtaposition. It will be appreciated that spacers between the stacked support members 86, 82, and 106 have been omitted from FIG. 7 for purposes of simplicity and clarity.

Resistive member 80 of the potentiometer is connected between a voltage source 108 and ground, while the wiper contact formed by conductive member 84 provides the potentiometer output or control voltage $V_1$. Common switch contact 88 is connected to voltage source 108 so as to be maintained at a constant voltage with respect to ground. Individual contacts 90, 92, 94, 96, 98, 100, 102, and 104 are connected to one terminal of respective light-emitting diodes (LED's) 110, 112, 114, 116, 118, 120, 122 124, and 126, the other terminals of which are grounded.

The two-tiered element of FIG. 7 is preferably configurated, in accordance with the principles described above with respect to FIG. 5, to achieve simultaneous actuation of the components on both tiers, depending upon the longitudinal position of the applied pressure. For example, if finger pressure is applied to member 86 at the right hand side of the element (as viewed in FIG. 7), a low or ground voltage appears as output voltage $V_0$, while the lowest voltage indicating LED 124 is lighted through the closed contacts 88 and 104. As the pressure moves continuously to the left along the top surface of member 86, the output voltage $V_0$ increases while LED 124 is de-energized and successive LED's 126, 124, 122, 120, 118, 116, 114, 112, and 110 are lighted and de-energized.

Figure 8:
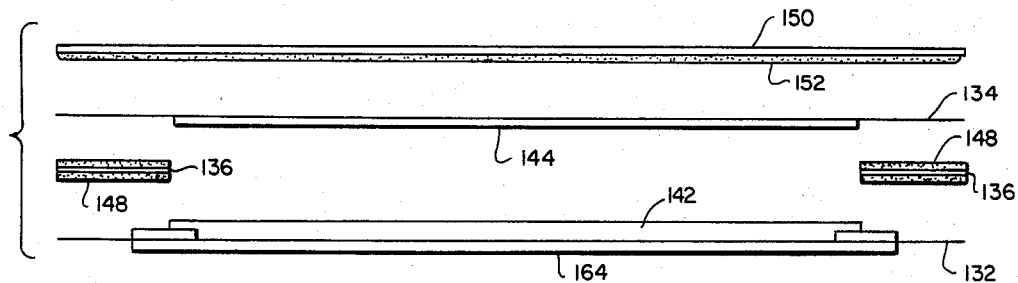
FIG. 8 is an exploded cross-sectional view of one more embodiment of the touch-controlled element of the present invention.
Figure 9:
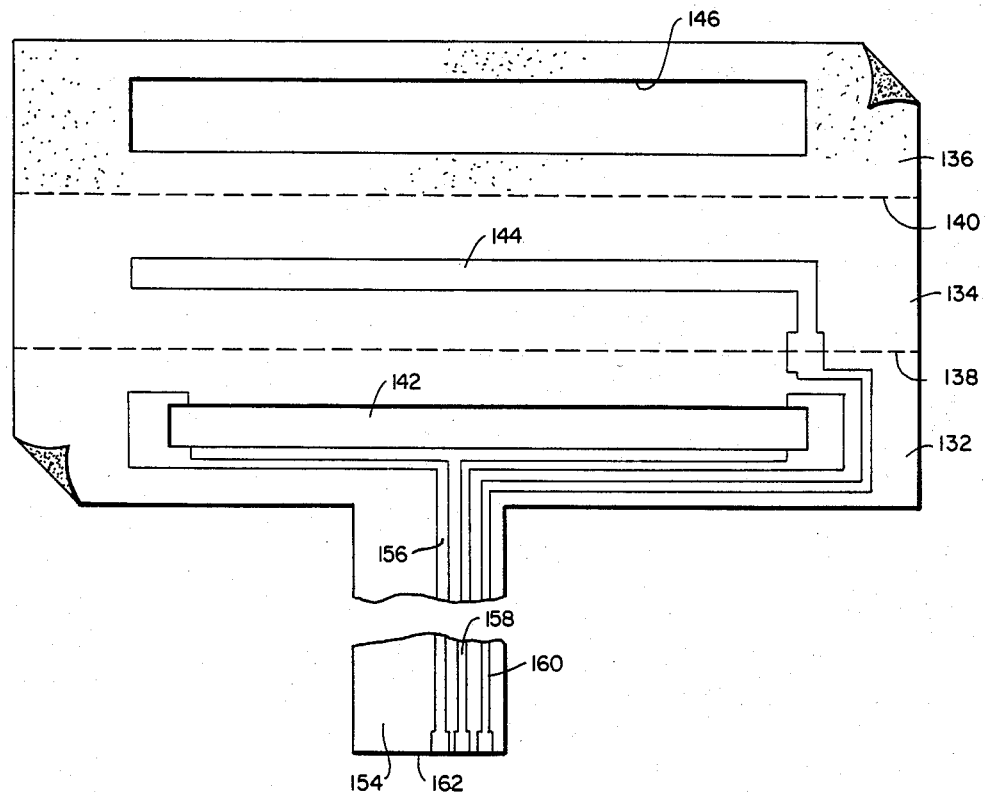
FIG. 9 is a plan view of a portion of the embodiment of the touch-controlled element illustrated in FIG. 8, shown in an intermediate stage of assembly.

As illustrated in FIGS. 8 and 9, a touch-controlled electrical element can be fabricated on a single sheet. In these figures, support member 130 has a generally rectangular configuration and is sub-divided into three equally-configured parallel sections 132, 134, and 136 by fold lines 138 and 140. An elongated, thin-layer resistive member 142 is adhered to one end section 132. A correspondingly elongated thin-layer conductive member 144 is secured to middle section 134 at a location overlying the resistive member in juxtaposition when section 134 is folded along fold line 138. The other end section 136 is provided with an elongated cut out portion which is at least co-extensive with conductive members 142 and 144 and positioned to overlie members 142 and 144 when section 136 is folded along fold line 140.

It should be noted that the fold along line 140 is made first such that section 136 is folded out of the plane of the drawing and into section 134 to expose member 144. The fold along line 138 is then made such that section 132 is also folded out from the plane of the drawing (FIG. 9) and onto section 136. In the final structure, cut-out or slot 146 serves as an insulative spacer frame between sections 132 and 134, thereby providing the space between conductive member 144 and resistive member 142. In this manner, finger pressure can be applied against the back side of conductive member 144 to urge that member against resistive member 142 at the point of applied finger pressure. Both surfaces of section 136 are coated with a pressure-sensitive adhesive 148 to assure adherence between section 136 and sections 134 and 136. Prior to assembly the pressure-sensitive adhesive coating may be covered with a removable protective paper covering according to well-known techniques.

As illustrated in the exploded side view of FIG. 8, a graphic overlay 150, with proper indicia on its top surface may be disposed on the surface of section 134 opposite conductive member 144. The underside of graphic overlay 150 is also provided with an adhesive coating 152 to assure adherence to section 134.

As illustrated in FIG. 9, the assembly may be provided with pre-assembled electrical contacts or terminals. A flap 154, in the form of an integral extension of the tri-section sheet, extends transversely from section 132. A first conductive strip or thin-layer extends from the distal end 162 of the flap, along the flap to section 132 and then bends to extend longitudinally along that section to electrically connect to one end of resistive member 142. A second thin-layer conductive strip 158 extends parallel to strip 156 along flap 154 from end 162 and then bends in the opposite direction along section 132 to join the opposite end of resistive member 142. Strips 156 and 158 are supply voltage connections to apply a differential voltage across resistive member 142 and establish the requisite voltage gradient thereacross. A third thin-layer conductive output strip 160 serves as an output connection. Strip 160 extends along the flap 154 from distal end 162, parallel to strips 156 and 158. Upon reaching section 132, strip 160 bends to extend longitudinally beyond one end of resistive member 142 and then bends again to extend transversely across section 132, beyond fold line 138 and into contact with conductive member 144. In the final product, flap 154 projects outwardly to receive appropriate external connections.

Section 132 is shown in FIG. 8 as having a member 164 secured to its surface opposite resistive member 142. This is provided only where a two-tiered element is required, in which case member 164 may be conductive or resistive. A further layer, with appropriate spacer, can be added over member 164 to complete the second tier. Alternatively, flap 154 can be provided at a short edge of section 132 and the sheet can be extended to five folded sections, the other two sections corresponding to a first section similar to section 134 joining the bottom edge of section 132 and spacer section similar to section 136 extending from the bottom of the first section and foldable between the first section and section 132. The aforesaid first section would have a suitable conductive or resistive member disposed therein for co-operation with member 164.

From the foregoing description, it will be appreciated that the novel pressure contact control apparatus disclosed herein clearly overcomes many of the longstanding problems in the related art by (1) providing a compact touch-controlled device which provides voltage selection over a first continuous range of voltages while additionally providing for separate and/or simultaneous voltage selection over additional discrete and/or continuous ranges of voltages; (2) providing such a touch-control device which can be configured so that all voltages may be selected by means of a common electrically conductive surface; (3) providing a touch-controlled device which may be costructed in one of several different configurations in order to meet the particular electronic and/or packaging needs of the user; (4) providing a simplified and efficient sample and hold circuit for receiving and storing voltage corresponding to those selected on the touch-controlled circuit apparatus; and (5) providing a touch-controlled device which includes a minimum number of component parts and is simple and inexpensive to manufacture.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A pressure contact control apparatus comprising:
    a first member having a first elongated electrically resistive surface on at least a part of a first side thereof;
    a second member having a first elongated electrically conductive surface on a first side thereof;
    at least one further surface on said first side of said first member having predetermined electrical conductivity characteristics, said further surface being spaced apart from said first resistive surface;
    means for supporting the first and second members such that the first conductive surface is presented in closely spaced proximity with respect to both said first resistive surface and said further surface; and
    wherein one of the first and second members is sufficiently flexible to permit electrical contact between a selected one of (a) the first conductive surface and the first resistive surface and (b) the first conductive surface and said further surface in response to application of localized pressure to at least one of the first and second members.

2. A pressure contact control apparatus as defined in claim 1 further comprising:
    a third member having a surface of known electrical conductivity characteristics;
    a second elongated electrically conductive surface on the other side of said first member, said second electrically conductive surface being at least partially aligned depthwise with at least one of the first resistive surface and said further surface, and said second electrically conductive surface facing away from the first resistive surface;
    means for supporting the third member in juxtaposition to said first member such that the second conductive surface is presented in closely spaced proximity with respect to said other side of said first member; and
    wherein at least one of said first and third members is sufficiently flexible to permit selective electrical contact between said second conductive surface and the surface of the third member in response to application of localized pressure to at least one of said first and third members.

3. A pressure contact control apparatus as defined in claim 2 wherein the surface of the third member is at least in part electrically resistive.

4. A pressure contact control apparatus as defined in claim 2 wherein said surface of the third member is at least in part electrically conductive.

5. A pressure contact control element as defined in claim 1 further comprising:
    a third member having a second electrically conductive surface;
    an additional surface having known electrical conductivity characteristics on the other side of said first member, said additional surface being at least partially aligned depthwise with said second conductive surface;
    means for supporting the third member in juxtaposition to said first member such that said second conductive surface and said additional surface are in closely spaced proximity; and
    wherein at least one of said first and third members is sufficiently flexible to permit selective electrical contact between the second conductive surface and the additional surface in response to application of localized pressure to at least one of said first and third members.

6. A pressure contact control apparatus as defined in claim 5 wherein said additional surface is electrically resistive.

7. A pressure contact control apparatus as defined in claim 5 wherein said additional surface is electrically conductive.

8. A pressure contact control apparatus as defined in claim 1 wherein said further surface is electrically conductive so as to cooperate with said first conductive surface to comprise a switch.

9. A pressure contact control apparatus as defined in claim 8 further comprising:
    a third member having a surface of known electrical conductivity characteristics;
    a second elongated electrically conductive surface on the other side of said first member, said second electrically conductive surface being at least partially aligned depthwise with at least one of the first resistive surface and said further surface, and said second electrically conductive surface facing away from the first resistive surface;

means for supporting the third member in juxtaposition to said first member such that the second conductive surface is presented in closely spaced proximity with respect said other side of said first member; and wherein at least one of said first and third members is sufficiently flexible to permit selective electrical contact between said second conductive surface and the surface of the third member in response to application of localized pressure to at least one of said first and third members.

10. A pressure contact control apparatus as defined in claim 8 further comprising:

a third member having a second electrically conductive surface;

an additional surface having known electrical conductivity characteristics on the other side of said first member, said additional surface being at least partially aligned depthwise with said second conductive surface;

means for supporting the third member in juxtaposition to said first member such that said second conductive surface and said additional surface are in closely spaced proximity; and wherein at least one of said first and third members is sufficiently flexible to permit selective electrical contact between the second conductive surface and the additional surface in response to application of localized pressure to at least one of said first and third members.

11. A pressure contact control apparatus as defined in claim 1 wherein said further surface is electrically resistive so that each of said first resistive surface and said further surface co-operates with said conductive surface to comprise respective potentiometers.

12. A pressure contact control apparatus as defined in claim 11 further comprising:

a third member having a surface of known electrical conductivity characteristics;

a second elongated electrically conductive surface on the other side of said first member, said second electrically conductive surface being at least partially aligned depthwise with at least one of the first resistive surface and said further surface, and said second electrically conductive surface facing away from the first resistive surface;

means for supporting the third member in juxtaposition to said first member such that the second conductive surface is presented in closely spaced proximity with respect to said other side of said first member; and wherein at least one of said first and third members is sufficiently flexible to permit selective electrical contact between said second conductive surface and the surface of the third member in response to application of localized pressure to at least one of said first and third members.

13. A pressure contact control apparatus as defined in claim 11 further comprising:

a third member having a second electrically conductive surface;

an additional surface having known electrical conductivity characteristics on the other side of said first member, said additional surface being at least partially aligned depthwise with said second conductive surface;

means for supporting the third member in juxtaposition to said first member such that said second conductive surface and said additional surface are in closely spaced proximity; and wherein at least one of said first and third members is sufficiently flexible to permit selective electrical contact between the second conductive surface and the additional surface in response to application of localized pressure to at least one of said first and third members.

14. A pressure contact control apparatus as defined in claim 11 further comprising an additional conductive surface on the second member in spaced longitudinal alignment with said first resistive surface and said further surface and presented in closely spaced proximity with respect to the first conductive surface to provide a selectively actuable electrical switch which is actuable when said additional and first conductive surfaces are brought into contact by flexure of said one of the first and second members.

15. A pressure contact control apparatus as defined in claim 14 further comprising:

a third member having a surface of known electrical conductivity characteristics;

a second elongated electrically conductive surface on the other side of said first member, said second electrically conductive surface being at least partially aligned depthwise with at least one of the first resistive surface and said further surface, and said second electrically conductive surface facing away from the first resistive surface;

means for supporting the third member in juxtaposition to said first member such that the second conductive surface is presented in closely spaced proximity with respect to said other side of said first member; and wherein at least one of said first and third members is sufficiently flexible to permit selective electrical contact between said second conductive surface and the surface of the third member in response to application of localized pressure to at least one of said first and third members.

16. A pressure contact control apparatus as defined in claim 14 further comprising:

a third member having a second electrically conductive surface;

an additional surface having known electrical conductivity characteristics on the other side of said first member, said additional surface being at least partially aligned depthwise with said second conductive surface;

means for supporting the third member in juxtaposition to said first member such that said second conductive surface and said additional surface are in closely spaced proximity; and wherein at least one of said first and third members is sufficiently flexible to permit selective electrical contact between the second conductive surface and the additional surface in response to application of localized pressure to at least one of said first and third members.

17. A pressure contact control apparatus as defined in claim 1 further comprising means for storing a signal representative of the most recent point of contact between said first conductive surface and said first resistive and further surfaces.

18. A pressure contact control apparatus as defined in claim 17 wherein the storing means comprises a sample and hold circuit including a capcitance connected between said first conductive surface and a reference point.

19. A pressure contact control apparatus as defined in claim 17 wherein the storing means comprises a sample and hold circuit including a resistance and a capacitance, said resistance being connected between said first conductive surface and said capacitance, said capacitance being connected between said resistance and a reference point.

20. A pressure contact control apparatus as defined in claim 1 wherein the first and second members are respective sections of a common structure in which said first member section is folded over said second member section along a fold line extending parallel to the longitudinal dimension of the first resistive surface, and wherein the supporting means includes spacer means disposed between the first and second member sections for maintaining the first conductive surface spaced from the resistive and further surfaces.

21. A pressure contact control apparatus comprising:
a first member comprising first and second surfaces having predetermined electrical conductivity characteristics on one side thereof, said second surface being substantially co-planar with the first surface;
a second member comprising a first electrically conductive surface;
means for supporting the first and second members such that said first conductive surface is presented in closely spaced proximity with respect to both the first and second surfaces of said first member; and
wherein one of the first and second members is sufficiently flexible to permit electrical contact between the first conductive surface of said second member and a selected one of the first and second surfaces of said first member in response to application of localized pressure to at least one of the first and second members.

22. A pressure contact control apparatus as defined in claim 21 further comprising:
a third member comprising a third surface of known electrical conductivity characteristics;
a second electrically conductive surface on the other side of said first member, said second electrically conductive surface being at least partially aligned depthwise with said third surface and facing said third surface;
means for supporting said third member in juxtaposition to said first member in closely spaced proximity thereto; and
wherein at least one of said first and third members is sufficiently flexible to permit selective electrical contact between said second conductive surface and said third surface in response to application of localized pressure to at least one of said first and third members.

23. A pressure contact control apparatus as defined in claim 22 wherein said third surface of the third member is electrically resistive.

24. A pressure contact control apparatus as defined in claim 22 wherein said third surface of the third member is electrically conductive.

25. A pressure contact control apparatus as defined in claim 21 further comprising:
a third member having a second electrically conductive surface;
an additional surface having known electrical conductivity characteristics on the other side of said first member, said additional surface being at least partially aligned depthwise with said second conductive surface and facing said second conductive surface;
means for supporting the third member in juxtaposition to said first member such that said second conductive surface and said additional surface are in closely spaced proximity; and
wherein at least one of said first and third members is sufficiently flexible to permit selective electrical contact between the second conductive surface and the additional surface in response to application of localized pressure to at least one of said first and third members.

26. A pressure contact control apparatus as defined in claim 25 wherein said additional surface is electrically resistive.

27. A pressure contact control apparatus as defined in claim 25 wherein said additional surface is electrically conductive.

28. A pressure contact control apparatus as defined in claim 21 further comprising means for storing a signal representative of the most recent point of contact between said first conductive surface and said first resistive and further surfaces.

29. A pressure contact control apparatus as defined in claim 28 further comprising a sample and hold circuit including a capacitance connected between the first conductive surface and a reference point.

30. A pressure contact control apparatus as defined in claim 28 further comprising a sample and hold circuit including a resistance and a capacitance, said resistance being connected between the first conductive surface and the capacitance, and said capacitance being connected between the resistance and a reference point.

31. A pressure contact control apparatus as defined in claim 21 wherein the first and second members are respective sections of a common structure in which the first member section is folded over the second member section along a fold line extending parallel to the longitudinal dimension of the first resistive surface, and wherein the supporting means includes spacer means between the first and second member sections for maintaining the first conductive surface spaced from the resistive and further surfaces.

32. A pressure contact control apparatus comprising:
a first member, having a first surface of a first predetermined electrical conductivity characteristic:
a second member having a second surface of a second predetermined electrical conductive characteristic;
a third member having first and second oppositely facing sides;
a third surface disposed on the first side of the third member and having a third predetermined electrical conductivity characteristic;
a fourth surface of said third member disposed on the second side of the third member and having a fourth predetermined electrical conductivity characteristic;
means supporting the first, second, and third members in a stack with the third member disposed between said first and second members, with the first and third surfaces mutually presented in closely spaced proximity, and with the second and fourth surfaces mutually presented in closely spaced proximity; and wherein at least two of the members are sufficiently flexible to permit selectively galvanic contact between the first and third surfaces and between the second and fourth surfaces in response to application of localized pressure to said members.

33. A pressure contact control apparatus as defined in claim 32 wherein the first surface is electrically conductive and is elongated, wherein the third surface is electrically resistive and is elongated in substantial alignment with the first surface, and wherein the second and fourth surfaces are electrically conductive.

34. A pressure contact control apparatus as defined in claim 32 wherein the first and third surfaces comprise a potentiometer, and wherein the second and fourth surfaces comprise an electrical switch.

35. A pressure contact control apparatus as defined in claim 34, wherein the first surface is electrically conductive and is elongated, wherein the third surface is electrically resistive and is elongated in substantial alignment with the first surface, and wherein the second and fourth surfaces are electrically conductive.

36. A pressure contact control apparatus as defined in claim 32 further comprising means for storing a signal representative of the most recent point of contact between the conductive surface and the resistive and further surfaces.

37. A pressure contact control apparatus as defined in claim 36 wherein the storing means comprises a sample and hold circuit including a capacitance connected between one of said surfaces and a reference point.

38. A pressure contact control apparatus as defined in claim 36 further comprising a sample and hold circuit including a resistance and a capacitance connected in series between one of said surfaces and a reference point, there being a junction between the resistance and capacitance serving as an output terminal for the apparatus.

39. A pressure contact control apparatus as defined in claim 32 further comprising a fifth surface of the third member, spaced from the third surface, and presented in close proximity to the first surface, said fifth surface having a fifth predetermined electrical conductivity characteristic.

40. A pressure contact control apparatus as defined in claim 32 further comprising:

a fifth surface of the first member, said fifth surface having a fifth predetermined electrical conductivity characteristic; and a sixth surface of the first side of the third member presented in closely spaced proximity to the fifth surface, said sixth surface having a sixth predetermined electrical conductive characteristic.

41. A pressure contact control apparatus as defined in claim 40 wherein the first and fifth surfaces are elongated and longitudinally aligned, and wherein the fifth and sixth surfaces are elongated and longitudinally aligned.

42. A pressure contact control apparatus as defined in claim 40 wherein the fifth surface and the first surface are substantially parallel, and wherein the third surface and the sixth surface are substantially parallel.

43. A pressure contact control apparatus as defined in claim 39 further comprising:

a seventh surface of the second member, said seventh surface having a seventh predetermined electrical conductivity characteristic; and an eighth surface of the second side of the third member presented in closely spaced proximity to the seventh surface, said eighth surface having an eighth predetermined electrical conductivity characteristic.

44. A pressure contact control apparatus as defined in claim 40 wherein the first and third surfaces are elongated and substantially co-extensive, and wherein the fifth and sixth surfaces are spaced from the first and third surfaces, respectively.

45. A pressure contact control apparatus as defined in claim 44 wherein the first and fifth surfaces are elongated and longitudinally aligned, and wherein the fifth and sixth surfaces are elongated and longitudinally aligned.

46. A pressure contact control apparatus as defined in claim 44 wherein the fifth surface and the first surface are substantially parallel, and wherein the third surface and the sixth surface are substantially parallel.

47. A pressure contact control apparatus as defined in claim 43 wherein the fifth and sixth surfaces are elongated and substantially co-extensive.

48. A pressure contact control apparatus as defined in claim 47 wherein the first and fifth surfaces are elongated and longitudinally aligned, and wherein the fifth and sixth surfaces are elongated and longitudinally aligned.

49. A pressure contact control apparatus as defined in claim 47 wherein the fifth surface and the first surface are substantially parallel, and wherein the third surface and the sixth surface are substantially parallel.

* * * * *

UNITED STATES PATENT AND TRADEMARK OFFICE
CERTIFICATE OF CORRECTION

PATENT NO. : 4,494,105

DATED : January 15, 1985

INVENTOR(S) : V. Dean House

It is certified that error appears in the above-identified patent and that said Letters Patent is hereby corrected as shown below:

```
Column 1, line 23, "having" should be --have--
Column 1, line 36, "Ahno" should be "Ohno"
Column 2, line 32, "pore" should be --more--
Column 3, line 15, "which" should be --while--
Column 4, line 16, "continuos" should be --continuous--
Column 6, line 5, "finger tip" should be --fingertip--
Column 6, line 28, "shown" should be --above--
Column 8, line 32, "finger tip" should be --fingertip--
Column 9, line 64, "right hand side" should be --right-hand side--
Column 11, line 31, "costructed" should be --constructed--
Column 13, line 8, "with respect said" should be --with respect to said--
```

Signed and Sealed this

Twenty-fifth Day of June 1985

[SEAL]

Attest:

DONALD J. QUIGG

Attesting Officer   Acting Commissioner of Patents and Trademarks